United States Patent
Mensler et al.

(10) Patent No.: US 10,605,845 B2
(45) Date of Patent: Mar. 31, 2020

(54) ESTIMATION OF THE INSULATION RESISTANCE BETWEEN A MOTOR VEHICLE BATTERY AND THE EARTH

(71) Applicant: RENAULT s.a.s., Boulogne-billancourt (FR)

(72) Inventors: Michel Mensler, Montigny le bretonneux (FR); Ludovic Merienne, Gif sur Yvette (FR)

(73) Assignee: RENAULT s.a.s., Boulogne-billancourt (FR)

( * ) Notice: Subject to any disclaimer, the term of this patent is extended or adjusted under 35 U.S.C. 154(b) by 83 days.

(21) Appl. No.: 15/101,741

(22) PCT Filed: Dec. 2, 2014

(86) PCT No.: PCT/FR2014/053115
§ 371 (c)(1),
(2) Date: Jul. 27, 2016

(87) PCT Pub. No.: WO2015/082825
PCT Pub. Date: Jun. 11, 2015

(65) Prior Publication Data
US 2016/0334452 A1    Nov. 17, 2016

(30) Foreign Application Priority Data

Dec. 4, 2013 (FR) .................................... 13 62092

(51) Int. Cl.
*G01R 27/18* (2006.01)
*G01R 31/00* (2006.01)
*G01R 31/02* (2006.01)

(52) U.S. Cl.
CPC ........... *G01R 31/007* (2013.01); *G01R 27/18* (2013.01); *G01R 31/025* (2013.01)

(58) Field of Classification Search
CPC ..................................................... G01R 27/18
See application file for complete search history.

(56) References Cited

U.S. PATENT DOCUMENTS

2008/0303543 A1* 12/2008 Cop ...................... G01R 31/343
324/765.01
2009/0289639 A1* 11/2009 Kawamura .......... G01R 27/025
324/658

(Continued)

FOREIGN PATENT DOCUMENTS

DE    10 2010 006 108 A1    8/2011
FR        2 987 133 A1    8/2013

(Continued)

OTHER PUBLICATIONS

International Search Report dated Mar. 3, 2015 in PCT/FR2014/053115 filed on Dec. 2, 2014.

(Continued)

*Primary Examiner* — Hyun D Park
(74) *Attorney, Agent, or Firm* — Oblon, McClelland, Maier & Neustadt, L.L.P.

(57) ABSTRACT

A method for estimating an insulation resistance between a point of a high-voltage circuit including a high-voltage motor vehicle battery and a ground of the vehicle includes measuring a voltage value at terminals of a measurement circuit that includes a capacitive element connected to the battery and calculating a standard deviation value based on the measured voltage value and based on a theoretical voltage value estimated from a model of the measurement circuit. The model is a function of a capacitance value of the capacitive element. The method also includes calculating an averaged deviation value from the standard deviation value and previous deviation values and estimating an updated insulation resistance value in accordance with the averaged deviation value.

11 Claims, 2 Drawing Sheets

(56) References Cited

U.S. PATENT DOCUMENTS

| | | | |
|---|---|---|---|
| 2010/0244850 A1 | 9/2010 | Yano et al. | |
| 2011/0304339 A1* | 12/2011 | Schumacher | G01R 31/025 324/509 |
| 2012/0022816 A1* | 1/2012 | Zenati | G01R 31/3624 702/63 |
| 2012/0126839 A1* | 5/2012 | Schaefer | G01R 27/025 324/750.01 |

FOREIGN PATENT DOCUMENTS

| | | | | |
|---|---|---|---|---|
| JP | 2003-250201 A | 9/2003 | | |
| WO | WO 2012036498 A2 * | 3/2012 | | G01R 27/025 |
| WO | WO 2013045871 A1 * | 4/2013 | | H04M 3/305 |

OTHER PUBLICATIONS

French Preliminary Search Report dated Sep. 23, 2014 in Patent Application No. 1362092 filed on Dec. 4, 2013.

Jingxin Li, et al., "Research on Insulation Resistance On-Line Monitoring for Electric Vehicle", Electrical Machines and Systems, Proceedings of the Eighth International Conference on Nanjing, China, XP010877521, vol. 1, Sep. 2005, pp. 814-817.

* cited by examiner

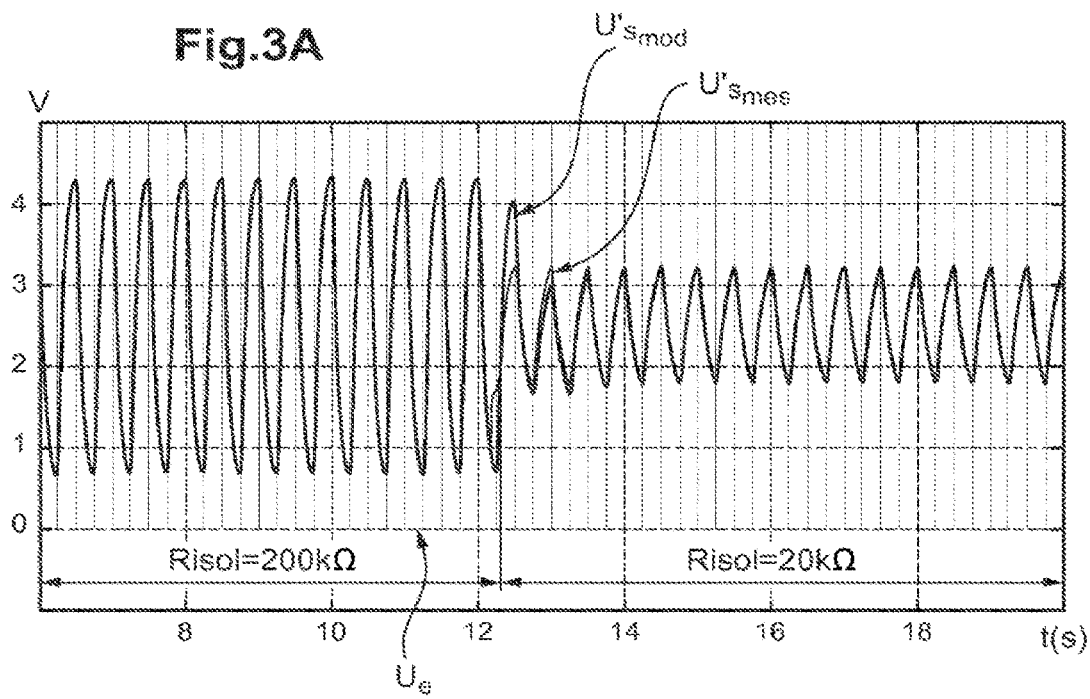
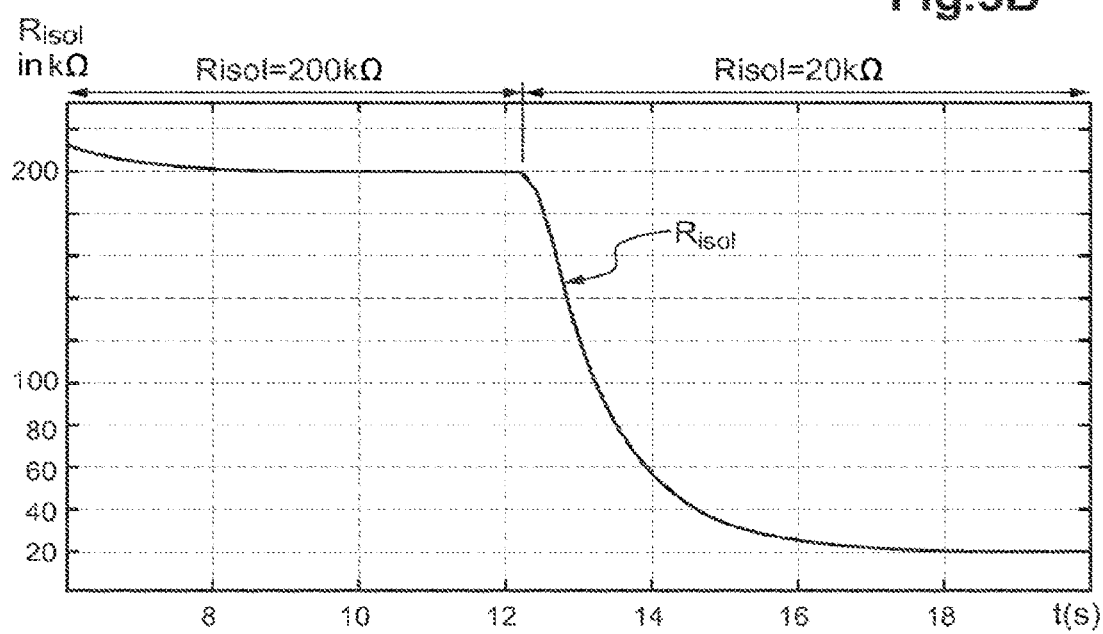

ESTIMATION OF THE INSULATION RESISTANCE BETWEEN A MOTOR VEHICLE BATTERY AND THE EARTH

The invention relates to the estimation of the insulation resistance between a point of a high-voltage circuit and an earth. In particular, the invention can relate to the detection of insulation faults between any point of a high-voltage circuit including a high-voltage battery of a motor vehicle and the earth of this vehicle.

The high-voltage battery of the motor vehicle can be a vehicle traction battery.

The vehicle can be an electric or hybrid vehicle.

It is important to measure the insulation resistance between the points of the high-voltage circuit and the earth of the vehicle to prevent any electric shock of the vehicle passengers, or anyone coming into contact with the vehicle. In particular, this detection allows a first insulation fault to be corrected before a second insulation fault occurs. A double fault can create a short circuit, which may cause a vehicle breakdown.

It is known to measure this insulation resistance using a discrete measurement circuit. For example, document JP3783633 describes a relatively simple circuit for measuring insulation resistance. An insulation resistance value can thus be deduced from a single measured voltage value, but this estimation is performed by assuming that a capacitance value between the measurement circuit and the battery is well known. The value of this capacitance is likely to vary, depending on various parameters such as the temperature or aging, for example. Such a process can therefore lack robustness.

Document FR2987133 discloses a more robust process, based on the identification of parameters, wherein several values of a voltage signal are measured at the terminals of a measurement circuit, and wherein a capacitance value between the measurement circuit and the battery, and an insulation resistance value can be deduced from this set of values simultaneously. However, the calculations are relatively elaborate and calculation time can be relatively long due to the number of measured values necessary.

An estimation is therefore needed to reconcile simplicity and robustness.

A method is proposed to estimate the insulation resistance between a point of a high-voltage circuit, in particular a terminal of a motor vehicle battery, such as a high-voltage battery of an electric or hybrid vehicle, and an earth, such as the earth of this vehicle. This method comprises:
(a) measuring or receiving a voltage value measured at the terminals of a measurement circuit, said measurement circuit comprising a capacitive element connected to the high-voltage circuit, for example to the battery,
(b) calculating a standard deviation value based on the measured voltage value and on a theoretical voltage value estimated from a model of the measurement circuit, said model being a function of a capacitance value of the capacitive element,
(c) calculating an averaged deviation value from the standard deviation value and a plurality of previous deviation values, and
(d) estimating an updated insulation resistance value in accordance with said averaged deviation value.

Such a method has been shown to be relatively robust in relation to possible variations in the capacitance value of the capacitive element.

This capacitance value can influence the variations of the measured voltage values over time. The averaged deviation value is thus relatively unaffected by possible variations in the capacitance value of the capacitive element. In other words, a regulator is set up to overcome the variations related to inaccuracy concerning the capacitance value of the capacitive element.

Advantageously and without limitation, the method may further comprise a step of generating an alarm signal, according to the insulation resistance value updated at step (d), to prevent the detection of an insulation fault.

Modeling can advantageously also be a function of a previous insulation resistance value between the high-voltage circuit and the earth.

Advantageously and without limitation, the steps (a), (b), (c), (d) can be regularly reiterated.

Advantageously and without limitation, at least one, and preferably each deviation value can be estimated from a measured voltage value and from a theoretical voltage value corresponding to the same iteration.

Advantageously and without limitation, the insulation resistance value updated during a standard iteration can be chosen as an insulation resistance value prior to the next iteration.

Advantageously and without limitation, the capacitive value of the capacitive element used to model the measurement circuit can be chosen equal to a constant value over several iterations, such as on a predetermined number of iterations or even throughout the execution of the method.

Alternatively, this capacitance value can also be updated, for example at each iteration, or cycle, according to the updated insulation resistance value and based on the voltage value measured at the output of the measurement circuit.

Advantageously and without limitation, during step (c) the standard deviation value can be calculated by taking the difference between the theoretical value and the measured value, or vice versa. Alternatively, a ratio could also be calculated between measured and theoretical values, or other values.

Advantageously and without limitation, during step (c) for calculating the deviation value, the difference is multiplied by +1 or −1 based on the value of an input signal of the measurement circuit.

Thus, a regulator can be implemented with, at the input, a difference between a measurement and an estimation from a model, weighted by a sign dependent on the value of the signal at the input of the measurement circuit.

In particular, this weighting may be 1 when the input signal is high, i.e. for a rising edge, and −1 in the case of a falling edge, i.e. when the input signal is low.

Advantageously and without limitation, the averaged deviation value can be obtained by adding a previous averaged deviation value to the standard deviation value. This previous averaged deviation value may advantageously be itself a sum, for example a discrete sum or an integral. Thus, rather than keeping all the previous deviation values in memory, it is enough to simply store the previous averaged deviation value.

The invention is in no way limited to the use of the previous averaged deviation value, or even to the choice of a sum of deviation values. One could, for example, calculate a linear combination of previous and current deviation values, or even a geometric average, a median, a quadratic mean, or other.

Advantageously and without limitation, the step (e) for estimating the updated insulation resistance value may be a function of a linear combination of the standard deviation value and the current averaged deviation value.

Advantageously and without limitation, the updated insulation resistance value can thus be estimated according to the formula:

$$R_{isol}(n)=K_{variable}[R_{isol}(n-1)](K_p\varepsilon+K_i\!\!\int\!\varepsilon)$$

wherein n corresponds to the standard iteration (n−1) corresponding to the immediately preceding iteration, $R_{isol}(n)$ represents the updated insulation resistance value for this iteration, $R_{isol}(n-1)$ is the updated resistance value updated to the preceding iteration, ε is a deviation value between theoretical and measured voltage values, this deviation value being obtained through weighting by +1 or −1, depending on the signal at the input of the measurement circuit, a value of difference between the theoretical and measured values, $K_i$ and $K_p$ are predetermined constants, and $K_{variable}$ is a dimensionless parameter value.

Advantageously and without limitation, the formula used to estimate the standard value of the insulation resistance can be a function of the previous insulation resistance value.

Thus, this parameter $K_{variable}$ may itself be a function of the previous insulation resistance value.

Thus, a gain table can be defined based on the insulation resistance value, for example. These values of the $K_{variable}$ parameter can be defined according to external constraints such as the maximum detection time authorized to calculate and issue an insulation resistance value. This can allow for more rapid convergence towards a relatively stable insulation resistance value.

Thus, the measurement circuit can undergo modeling, this modeling being used to estimate the theoretical values of the signal from a previous value of the insulation resistance and from supposedly known values of the different components of the measurement circuit.

In an advantageous embodiment, the deviation between the theoretical and measured values may be weighted by a sign based on the value of the signal at the input of the measurement circuit then an integral proportional regulator can allow a standard value of the insulation resistance to be estimated based on this deviation and an average of the deviations obtained over time. Once the insulation resistance has been updated in this manner, the numerical model of the circuit can in turn be updated.

This method may further comprise a step of transmitting the alarm signal, generated based on the value of the updated insulation resistance, to a user interface.

Thus, this method can detect the insulation faults more rapidly than described in document FR2987133, and while avoiding accuracy-related errors with regards to the value of the capacitive element.

A computer program product is further proposed comprising instructions to perform the steps of the method described above when these instructions are executed by a processor. This program can, for example, be stored on a hard drive type of memory media, downloaded, or other.

A device is also proposed for estimating the insulation resistance between a point of a high-voltage circuit including a high-voltage motor vehicle battery and the earth of the vehicle, which includes:

receiving means to receive a voltage value measured at the terminals of a measurement circuit, said measurement circuit comprising a capacitive element connected to the battery, a memory for storing a model of the measurement circuit, said model being a function of a capacitance value of the capacitive element, and processing means arranged to calculate a standard deviation value based on the measured voltage value and based on a theoretical voltage value estimated from the model of the measurement circuit, in order to calculate a deviation value averaged from the standard deviation value and a plurality of previous deviation values, and to estimate an insulation resistance value updated according to said averaged deviation value.

The device, for example a microprocessor type processor, microcontroller, or other, can be used to implement the method described above.

The device can advantageously further comprise transmission means for transmitting an alarm signal generated according to the insulation resistance value estimated by the processing means, in order to report the detection of an insulation fault as necessary. The device can thus be an insulation fault detection device.

However, the invention is in no way limited to this insulation fault detection application.

The receiving means can for example include an input pin, an input port or other.

The memory can be RAM (Random Access Memory), EEPROM (Electrically-Erasable Programmable Read-Only Memory) or other.

The processing means can be a CPU (Central Processing Unit), for example.

The transmission means can include an output pin, an output port, or other, for example.

A system for estimating the insulation resistance between a point of a high-voltage circuit and an earth is further proposed, for example a system for detecting an insulation fault between a point of a high-voltage system and an earth, this system comprising a measurement circuit connected to the high-voltage circuit, for example to a battery, by a capacitive component, and an estimation device as described above, this estimation device being electrically connected to an input of the measurement circuit and to a measurement terminal of the measurement circuit in order to measure the voltage values.

The measurement circuit can be of relatively simple design, with for example an input resistor, a terminal of which is electrically connected to the input of the measurement circuit, and a low-pass filtering portion comprising a resistive element and a capacitive element.

A motor vehicle, for example an electric or hybrid vehicle, is further proposed comprising a battery adapted to rotate the front and/or rear wheels, and a system as described above.

The invention will become more apparent in reference to the figures which illustrate the embodiments without limitation and given solely by way of example.

FIG. 1 shows an example of a system for estimating insulation resistance, here an insulation fault detection system, according to one embodiment of the invention.

FIG. 2 schematically represents an example of the detection device according to an embodiment of the invention.

FIG. 3A is a graph showing the changes of a theoretical voltage signal and a measured voltage signal over time, during the application of an exemplary method according to an embodiment of the invention.

FIG. 3B is a graph, corresponding to the graph of FIG. 3A, showing the changes of the estimated insulation resistance value over time, upon application of this method.

Identical or similar references can be used from one figure to another to designate identical or similar elements, in their form or function.

Figure 1:
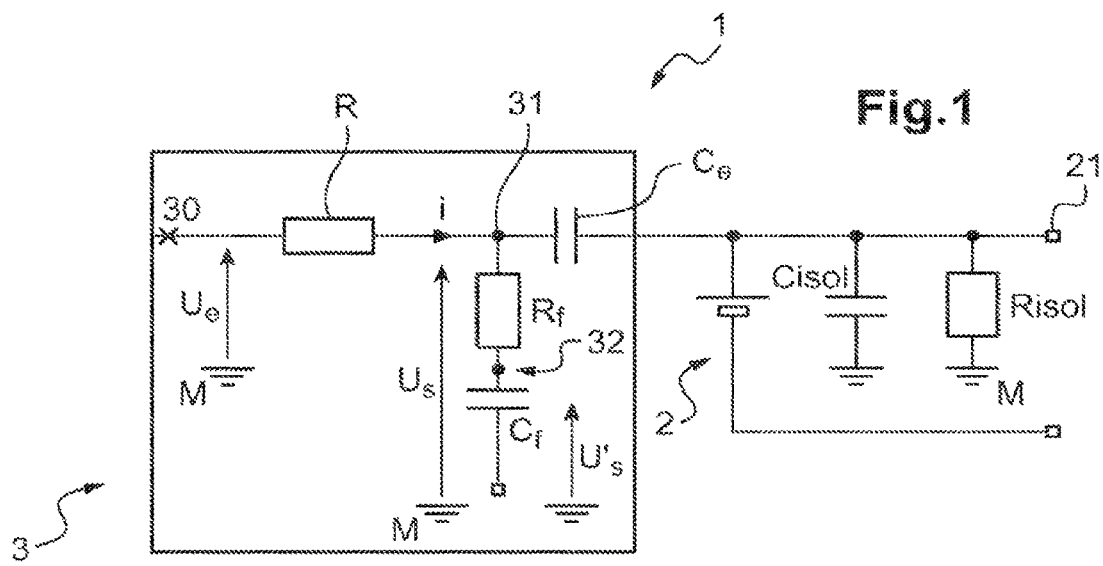

In reference to FIG. 1, an insulation fault detection system 1 is represented between a terminal 21 of a high-voltage circuit, here a high-voltage battery 2 of a motor vehicle, and the earth M of this motor vehicle.

This detection system 1 comprises a measurement circuit 3 and detection device not shown in FIG. 1, for example a processor.

The battery 2 is used to rotate the front and/or rear wheels of an electric or hybrid vehicle. Regenerative braking can be implemented, i.e. that when the driver imposes a braking setpoint, the energy can be recovered and stored in the battery 2.

The measurement circuit 3 comprises an input resistor R between an input terminal 30 and a connection terminal to the battery 31. The measurement circuit 3 further comprises, between the connection terminal 31 and the earth, a resistor $R_f$ and a capacitor $C_f$. An output voltage $U'_s$ is measured at a measurement point 32 between the resistor $R_f$ and the capacitor $C_f$. Here, the components $R_f$ and $C_f$ act as a low-pass filter.

An input voltage $U_e$ is controlled by the processor and a measurement of the output voltage $U'_s$, or $U'_{Smes}$, is received by this processor.

The measurement circuit 3 comprises a capacitive element $C_e$ between the battery 2 and the rest of the measurement circuit.

In FIG. 1 the capacitance Cisol and the resistance Risol represent the equivalent capacitance and equivalent resistance, respectively, between the terminal 21 of the high-voltage battery 2 and the earth.

An estimation of the value of this insulation resistance Risol is sought in order to trigger an alarm when this resistance is too low.

The input signal $U_e$ applied between the terminal 30 and earth can be of square type with a frequency $f_e$.

This signal can be generated relatively easily by the processor, such as a microprocessor of a BMS module, for example.

The values of the low-pass filtering elements $R_f$ and $C_f$ are known and vary relatively little over time.

The value of the input resistor R is also known.

However, the value of the capacitive element $C_e$ is likely to vary, with variations in the order of 30% in relation to the initial value, during the service life of the vehicle. And of course, the value of the insulation resistance Risol may vary notably in case of an insulation fault. The value of the insulation resistance is thus likely to pass from a few MOhms to only a few kOhms.

The transfer function between the output voltage and the input signal can be expressed as:

$$\frac{U'_s}{U_e} = \frac{1 + RisolC_e s}{1 + [C_e(Risol + R) + C_f(R_f + R)]s + [C_e C_f(RR_f + Risol(R + R_f))]s^2}$$

wherein s is the Laplace variable.

It is known to estimate both the value of the insulation resistance Risol and the capacitance value of the capacitive element $C_e$, by using a relatively large number of measurement points. Thus, the value of the insulation resistance is updated after a relatively long time. For example, for a frequency $f_e$ of the input signal $U_e$ in the order of 2 Hz, the acquisition frequency of the output signal $U'_s$ being in the order of 100 Hz, if the process requires 100 measurement points in order to produce a correct value, two periods are required, i.e. one second in order to be able to update the value of the insulation resistance.

The present invention may allow faster updating and particularly at each measurement, i.e. every 10 ms for example, and while ensuring convergence of the estimate regardless of the capacitance $C_e$.

It provides a discrete model of the measurement circuit. Using a bilinear transform, from the above equation, it is possible to calculate a circuit z-transform corresponding to a sampling period Te, for example 10 ms. By setting $$\frac{U'_s}{U_e} = \frac{1 + k_1 s}{1 + k_2 s + k_3 s^2}$$

and $$s = \frac{2}{T_e} \frac{1 - z^{-1}}{1 + z^{-1}},$$

we obtain:

$$\frac{U'_s}{U_e} = \frac{1 + \frac{2k_1}{T_e} + 2z^{-1}\left(1 - \frac{2k_1}{T_e}\right)z^{-2}}{1 + \frac{2k_2}{T_e} + \frac{4k_3}{T_e^2} + \left(2 - \frac{8k_3}{T_e^2}\right)z^{-1} + \left(1 + \frac{2k_2}{T_e} + \frac{4k_3}{T_e^2}\right)z^{-2}}$$

wherein the parameters $k_1$, $k_2$, and $k_3$ depend on the parameters of the measurement circuit and particularly on the value of the insulation resistance such that $k_1 = RisolC_e$, $k_2 = C_e(Risol+R) + C_f(R_f+R)$, and $k_3 = C_e C_f(RR_f + Risol(R+R_f))$ This model simulates the response of the measurement circuit.

Figure 2:
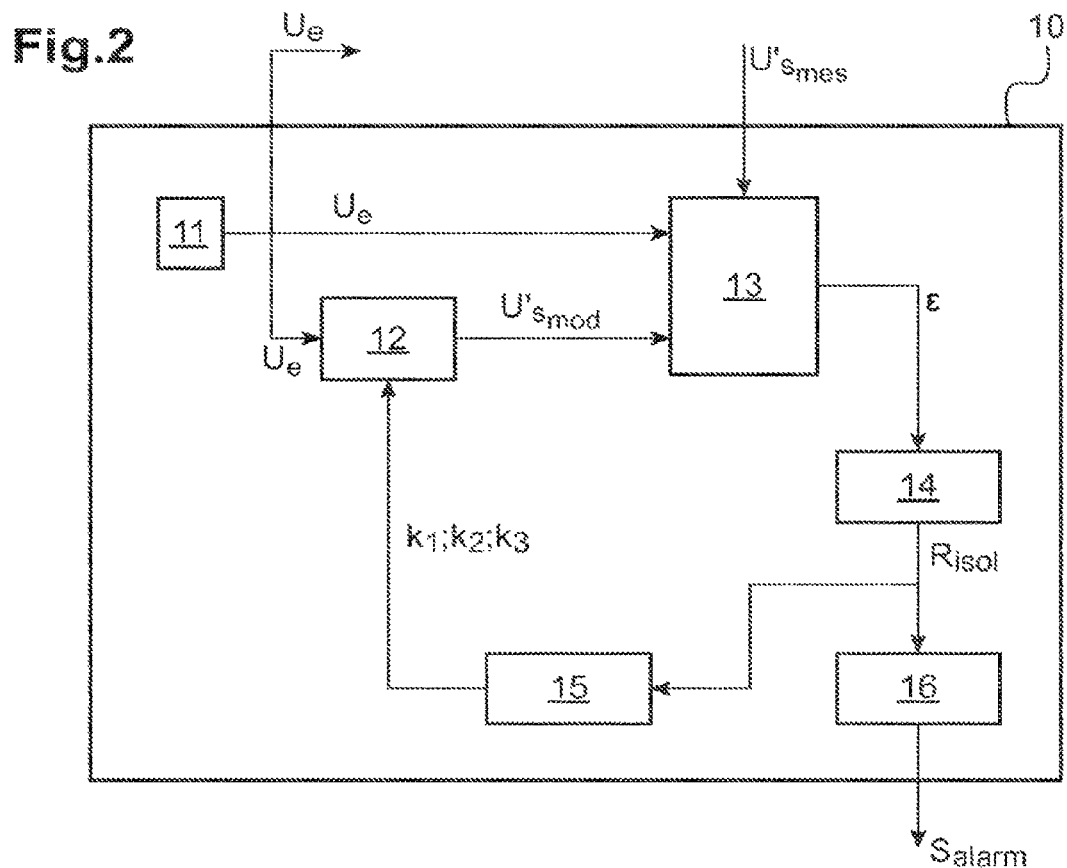

FIG. 2 schematically represents an example of an insulation fault detection device 10 between the traction battery referenced as 2 in FIG. 1 and the earth.

This device comprises a module 11 for generating an input signal $U_e$. This signal is sent to the terminal 30 of the measurement circuit and is also received at the input of a digital modeling module of the measurement circuit 12. This module 12 estimates, using the equations above and particularly the values of standard parameters $k_1$, $k_2$, and $k_3$, a theoretical value of the output signal $U'_{Smod}$.

This $U'_{Smod}$ value is received by a module for estimating the weighted deviation 13. This module 13 also receives a measured output signal value $U'_{Smes}$, i.e. a voltage value measured at the terminal 32 of the measurement circuit 3 of FIG. 1.

The module 13 calculates a difference between these two values $U'_{Smes}$ and $U'_{Smod}$. The sign of this difference is a function of the value of the input signal $U_e$.

As is clear from FIG. 2, the parameters $k_1$, $k_2$, and $k_3$ are regularly updated so that the model of the measurement circuit is regularly updated. Thus, the model used by the module 12 varies depending on the value of the estimated insulation resistance.

The value of this insulation resistance is estimated by determining the values that tend to minimize the deviation ε between the response of the physical circuit $U'_{Smes}$ and the output $U'_{Smod}$ model simulating the circuit. A regulator 14 makes it possible to estimate insulation resistance values $R_{isol}$, updated to converge the output of the $U'_{Smod}$ model with the U'$_{Smes}$ measurement. The value of the estimated insulation resistance R$_{isol}$ is updated at each calculation step.

The greater the value of the insulation resistance, the faster the response of the circuit to excitation as an input signal. In the case of a response of the measurement circuit to a rising edge of 5 Volts, i.e. when the input signal U$_e$ passes from 0 to 5 Volts, if the output of the U'$_{Smod}$ model is greater than the measured value U'$_{Smes}$, i.e. if the model is faster than the measurement, then the module 14 tends to reduce the value of the estimated insulation resistance, i.e. the model is slowed down.

Conversely, if the output value of the model U'$_{Smod}$ has a value less than a measured value U'$_{Smes}$, i.e. if the model is slower than the measurement, then the module 14 tends to increase the value of the estimated resistance R$_{isol}$.

In the case of a falling edge, i.e. when the input signal goes from 5 Volts to 0 Volts, the reverse reasoning is applied. Thus, if the output of the model U'$_{Smod}$ has a value greater than the measured value U'$_{Smcs}$, i.e. the model is slower than the actual physical circuit, then the insulation resistance value is increased, and vice versa otherwise.

The module 14 can thus be a proportional-integral type controller with a difference ε, at the input, between the measured value U'$_{Smes}$ and the theoretical value U'$_{Smod}$ weighted by a sign dependent on the value of the input signal U'$_e$. This weighting is +1 when the input signal is 5 Volts, i.e. in the case of a rising edge, and −1 when the input signal is 0 Volts, i.e. in the case of a falling edge.

To return to the model implemented in the module 12, noting the current time n, the previous time n−1, and the previous time before that n−2, this module 12 can implement the following formula:

$$U'_{S\,mod}(n) = \frac{\left(1 + \frac{2k_1}{T_e}\right)U_e(n) + 2U_e(n-1)}{1 + \frac{2k_2}{T_e} + \frac{4k_3}{T_e^2}} +$$

$$\frac{\left(1 - \frac{2k_1}{T_e}\right)U_e(n-2) + \left(\frac{8k_3}{T_e^2} - 2\right)U'_{S\,mod}(n-1)}{1 + \frac{2k_2}{T_e} + \frac{4k_3}{T_e^2}} -$$

$$\frac{\left(1 + \frac{2k_2}{T_e} + \frac{4k_3}{T_e^2}\right)U'_{S\,mod}(n-2)}{1 + \frac{2k_2}{T_e} + \frac{4k_3}{T_e^2}}$$

T$_e$ being the period of the input signal U$_e$.

The integral proportional regulator 14 can be adjusted based on the need and the compromise between speed and accuracy that is desired on the estimate.

As the range of insulation resistance values can be very broad, from a few Ohms to a few MOhms, one can also provide for a variable gain based on the estimated insulation resistance value. If this value is relatively high, in the order of several hundreds of kOhms or MOhms, the need for accuracy is less but we will instead be interested in a quick solution. On the contrary, for a relatively low insulation resistance value, in the order of a few tens of kOhms or less, better accuracy is needed as this value represents a danger threshold.

A gain table can thus be defined based on the value of the estimated insulation resistance. K$_{variable}$ values can be defined according to external constraints such as the maximum detection time authorized to calculate and issue an insulation resistance value.

The module 14 can thus implement the following formula:

$$R_{isol}(n) = K_{variable}[R_{isol}(n-1)](K_p\varepsilon + K_i\int\varepsilon)$$

wherein K$_i$ and K$_p$ are gains set offline by conventional methods for adjusting integral proportional correctors based on an arbitrary insulation resistance value. These parameter values K$_p$, K$_i$ are predetermined in this manner.

Once the insulation resistance estimate is updated, a module 15 allows the values of the parameters k$_1$, k$_2$, k$_3$ to be updated using the formula above wherein the value of the capacitance C$_e$ can be arbitrarily chosen with more or less 50% accuracy in relation to the actual ratio. The initial value of this capacitance can be used throughout the process, or at least during a certain number of cycles.

Once these parameters are updated, it is possible to calculate a new output of the model when based on this new updated estimation of the insulation resistance. Furthermore, a module 16 allows an alarm signal S$_{alarm}$ to be generated from the insulation resistance value provided by the model 14. This module 16 can for example compare the value of the insulation resistance to a threshold and trigger an alarm when the value of the insulation resistance is below this threshold.

In reference to FIG. 3A, the signal U'$_{Smod}$ is plotted against time and the signal U'$_{Smes}$. It is assumed that a few instants after t=12 seconds, the vehicle experiences an insulation fault and the value of the insulation resistance drops from 200 kOhms to 20 kOhms. This simulation represents a case where an insulation fault appears. It is clear that the response time is less than 5 seconds.

As shown in FIG. 3B, the value of the insulation resistance calculated by the integral proportional regulator 14 drops very quickly and converges to the actual value.

The invention thus allows insulation faults to be detected in a simple and robust manner owing to the tolerance to variations in the value of the capacitance C$_e$.

The invention claimed is:

1. A method for estimating an insulation resistance between a point of a high-voltage motor vehicle battery of an electric or hybrid vehicle and a ground of said electric or hybrid vehicle, the method comprising:
 (a) measuring a voltage value at terminals of a measurement circuit, said measurement circuit comprising a capacitive element connected to the high-voltage motor vehicle battery of said electric or hybrid vehicle;
 (b) calculating a standard deviation value based on the measured voltage value, and based on a theoretical voltage value estimated from a model of the measurement circuit, the measurement circuit being modeled using bilinear transformation, said model being a function of a capacitance value of the capacitive element of the measurement circuit that is connected to the high-voltage motor vehicle battery of said electric or hybrid vehicle;
 (c) calculating an averaged deviation value from the standard deviation value and previous deviation values;
 (d) estimating an updated insulation resistance value between the point of the high-voltage motor vehicle battery and the ground of the electric or hybrid vehicle, in accordance with said averaged deviation value; and
 (e) determining whether the updated insulation resistance value between the point of the high-voltage motor vehicle battery and the ground of the electric or hybrid vehicle is below a threshold, and generating an alarm signal to warn of detection of an insulation fault when the updated insulation resistance value is below the threshold.

2. The method according to claim 1, wherein
steps (a), (b), (c) and (d) are regularly reiterated, and
the insulation resistance value updated during a standard iteration is used in the next iteration for the model of the measurement circuit.

3. The method according to claim 1, wherein, during step (b), the standard deviation is calculated by taking a difference between the measured voltage value and the theoretical voltage value, a sign of said difference being a function of an input signal value of the measurement circuit.

4. The method according to claim 1, wherein, during step (c), the averaged deviation value is obtained by adding a previous averaged deviation value to the standard deviation value.

5. The method according to claim 1, wherein step (d) for estimating the updated insulation resistance value is a function of a linear combination of the standard deviation value and the averaged deviation value calculated in step (c).

6. The method according to claim 5, wherein, during step (d), the updated insulation resistance value is estimated according to formula:

$$R_{isol}(n)=K_{variable}[R_{isol}(n-1)](K_p\varepsilon+K_i\int\varepsilon)$$

wherein n corresponds to a standard iteration (n−1) corresponding to the immediately preceding iteration,
$R_{isol}(n)$ represents the insulation resistance value updated during the standard iteration,
$R_{isol}(n-1)$ represents a previous insulation resistance value,
$\varepsilon$ represents the standard deviation value,
$K_i$ and $K_p$ represent predetermined constants, and
$K_{variable}$ represents a parameter value selected as a function of the previous insulation resistance value.

7. A device for estimating an insulation resistance between a point of a high-voltage motor vehicle battery of an electric or hybrid vehicle and a ground of said electric or hybrid vehicle, the device comprising:
receiving means to receive a voltage value measured at terminals of a measurement circuit, said measurement circuit comprising a capacitive element connected to the high-voltage motor vehicle battery of said electric or hybrid vehicle;
a memory to store a model of the measurement circuit, the measurement circuit being modeled using bilinear transformation, said model being a function of a capacitance value of the capacitive element of the measurement circuit that is connected to the high-voltage motor vehicle battery of said electric or hybrid vehicle; and
processing means arranged to
calculate a standard deviation value based on the measured voltage value and based on a theoretical voltage value estimated from the model of the measurement circuit, in order to calculate a deviation value averaged from the standard deviation value and a plurality of previous deviation values,
estimate an insulation resistance value between the point of the high-voltage motor vehicle battery and the ground of the electric or hybrid vehicle, updated according to said averaged deviation value,
determine whether the updated insulation resistance value between the point of the high-voltage motor vehicle battery and the ground of the electric or hybrid vehicle is below a threshold, and
generate an alarm signal to warn of detection of an insulation fault when the updated insulation resistance value is below the threshold.

8. A system comprising:
the measurement circuit according to claim 7 that comprises the capacitive component electrically connected to the battery; and
the device, the device being electrically connected to an input of the measurement circuit, and to a measurement terminal of the measurement circuit.

9. The system according to claim 8, wherein the measurement circuit comprises:
an input resistor including a terminal that is electrically connected to the input of the measurement circuit; and
a low-pass filtering part comprising a resistive element and a capacitive element.

10. A motor vehicle, comprising:
the high-voltage motor vehicle battery to rotate front and/or rear wheels of the vehicle; and
the system according to claim 8.

11. A device for estimating an insulation resistance between a point of a high-voltage battery of an electric or hybrid vehicle and a ground of the electric or hybrid vehicle, the device comprising:
circuitry configured to
receive a voltage value measured at terminals of a measurement circuit, the measurement circuit comprising a capacitive element connected to the high-voltage motor vehicle battery of said electric or hybrid vehicle,
store, in a memory, a model of the measurement circuit, the measurement circuit being modeled using bilinear transformation, the model being a function of a capacitance value of the capacitive element of the measurement circuit that is connected to the high-voltage motor vehicle battery of said electric or hybrid vehicle,
calculate a standard deviation value based on the measured voltage value and based on a theoretical voltage value estimated from the model of the measurement circuit, in order to calculate a deviation value averaged from the standard deviation value and a plurality of previous deviation values,
estimate an insulation resistance value between the point of the high-voltage motor vehicle battery and the around of the electric or hybrid vehicle, updated according to the averaged deviation value,
determine whether the updated insulation resistance value between the point of the high-voltage motor vehicle battery and the ground of the electric or hybrid vehicle is below a threshold, and
generate an alarm signal to warn of detection of an insulation fault when the updated insulation resistance value is below the threshold.

* * * * *